United States Patent [19]

Drummond

[11] Patent Number: 5,306,945
[45] Date of Patent: Apr. 26, 1994

[54] FEATURE FOR A SEMICONDUCTOR DEVICE TO REDUCE MOBILE ION CONTAMINATION

[75] Inventor: Tracy W. Drummond, Boise, Id.

[73] Assignee: Micron Semiconductor, Inc., Boise, Id.

[21] Appl. No.: 968,086

[22] Filed: Oct. 27, 1992

[51] Int. Cl.⁵ .............................................. H01L 29/34
[52] U.S. Cl. .................................. 257/620; 257/306; 257/770; 257/297
[58] Field of Search ............... 257/620, 770, 306, 297

[56] References Cited

U.S. PATENT DOCUMENTS

| | | | |
|---|---|---|---|
| 4,364,078 | 12/1982 | Smith et al. | 257/620 |
| 4,753,709 | 6/1988 | Welch et al. | 257/760 |
| 4,841,354 | 6/1989 | Inaba | 257/620 |
| 5,016,081 | 5/1991 | Brown et al. | 257/763 |
| 5,218,219 | 6/1993 | Ajika et al. | 257/306 |

*Primary Examiner*—Robert Limanek
*Attorney, Agent, or Firm*—Kevin D. Martin

[57] ABSTRACT

A barrier for terminating the edge of a semiconductor die such as a dynamic random access memory device is disclosed. The barrier reduces contamination of the dielectric layers such as TEOS and BPSG from mobile ions which are inherent in fabrication materials. While the barrier can be formed at many points in the die fabrication process, its formation is preferably incorporated into the Metal1 mask, thereby preventing the need for an additional mask step. The barrier, if formed with the Metal1 mask, would therefore be formed from the material of the Metal1, conventionally tungsten, a tungsten alloy, or other metals.

21 Claims, 3 Drawing Sheets

FEATURE FOR A SEMICONDUCTOR DEVICE TO REDUCE MOBILE ION CONTAMINATION

FIELD OF THE INVENTION

This invention relates to the field of semiconductor manufacture. More specifically, a structure for a semiconductor device is described which reduces mobile ion contamination and problems resulting therefrom.

BACKGROUND OF THE INVENTION

Many types of semiconductor devices are made using similar manufacturing procedures. A starting substrate, usually a thin wafer of silicon or gallium arsenide, is doped, masked, and etched through several process steps, the steps depending on the type of devices being manufactured. This process yields a number of die on each wafer produced. Each die on the wafer is given a brief test for full functionality, and the nonfunctional die are mechanically marked or mapped in software. This brief test is only a gross measure of functionality, and does not insure that a die is completely functional or has specifications that would warrant its assembly in a package.

If the wafer has a yield of grossly functional die which indicates that a good quantity of die from the wafer are likely to be fully operative, the die are separated with a die saw, and the nonfunctional die are scrapped while the rest are individually encapsulated in plastic packages or mounted in ceramic packages with one die in each package. After the die are packaged they are rigorously electrically tested. Components which turn out to be nonfunctional or which operate at questionable specifications are scrapped or devoted to special uses.

Semiconductor devices, and specifically memory devices such as dynamic random access memories (DRAMs), function by having the ability to store a charge on a storage node. A typical DRAM cell is illustrated as shown in the FIG. 1 cross section. The transistor cell comprises source 10, drain 12, and channel 14 regions implanted into a substrate 16 of semiconductor material. In the cross section of FIG. 1, a portion of the gates 18 are formed over field (thick) oxide 20, and a portion of the gates 18 are separated from the channel 14 by gate (thin) oxide 22. Not shown in the FIG. 1 cross section is that each gate has a portion overlying the field oxide and a portion overlying the gate oxide. The storage node 24 contacts the transistor source 10, and the digit line 26 contacts the transistor drain 12.

To write a "0" to the storage node, for example, the digit line is grounded, the access gate is turned on, and any charge drains from the storage node across the channel to the drain. Conversely, to store a "1" on the storage node, the digit line is brought to +5 V, the access gate is turned on, and a charge flows from the drain to the source across the channel to charge the storage node to +5 V.

To read the cell, the digit line is brought to a reference voltage (for example 2.5 volts) which is monitored by a sense amplifier, and the access gate corresponding to the cell of interest is turned on. If the storage node is storing a low, the voltage on the digit line decreases, which is detected by the sense amplifier. Similarly, if the storage node is storing a high, the voltage on the digit line increases slightly, which is detected by the sense amp. Other methods of reading from and writing to the cell are also possible.

A voltage adjust implant to the channel region determines the potential between the storage node and the digit line which is required to trip the transistor, referred to as the threshold voltage ($V_t$). A threshold voltage of 2 V, for instance, would require a potential of 2 V between the digit line and the storage node to trip the transistor. If the $V_t$ is too low, the transistor will turn on during normal voltage differences such as voltage spikes. If low enough, the transistor can stay on all the time, which will result in a functional short between the digit line and the storage node. Conversely, if $V_t$ is too high, the transistor will not trip, thereby resulting in a functional open between the storage node and the digit line. During the voltage adjust implant of an N-type enhancement mode device, positive ions such as boron are implanted into the channel region to increase the trip voltage, while negative ions such as arsenic decreases the trip voltage. The opposite is true for P-type and depletion mode devices, in which negative ions increase $V_t$, while positive ions implanted in the channel region decrease the trip voltage. Note that the invention herein is described in terms of an N-type device, but its use with P-type devices is also possible by one of skill in the art.

One problem which can adversely affect device yields is contamination of the device from mobile ions, referred to as pseudoinjection. Mobile ion contamination, for example by sodium ions, can result from various process steps used during the manufacture of the semiconductor device and occurs when ions enter the substrate or other features thereby changing the conductivity of the feature. The ions are known to be more mobile at elevated temperatures. One type of mobile ion contamination occurs during elevated temperatures as the device is operating, for example during a device reliability test at elevated temperatures (burn-in) or during operation in the enclosed space of a computer housing. This can result in N-channel inversion, which effectively turns an enhancement device into a depletion device.

These positive ions have been found to travel easily through layers of tetraethyl orthosilicate (TEOS) and layers of borophosphosilicate glass, (BPSG) which are commonly used as dielectric layers during the manufacture of semiconductors, and may have the ability to travel through other materials as well. An N-type enhancement device which has contamination of the gate oxide from positive ions will have a lowered $V_t$ because of a biased gate above the channel region, thereby resulting in the problems described above.

Contamination of other dielectric features can result in other problems which are known in the art of semiconductor manufacture. Contamination can result at the periphery of a semiconductor die when a BPSG, TEOS, or other oxide layer is exposed during separation of the die during the wafer saw step, thereby resulting in failed bits or other features around the periphery of the die.

One method of preventing mobile ion contamination during this step is to terminate the oxide features along the saw kerf as shown in FIG. 2. A die incorporating this method of oxide termination comprises the use of passivation layers such as oxide 30 and nitride 32 around the periphery near the saw kerf 34 to prevent mobile ions from entering the BPSG 36 or the TEOS 38. One problem with terminating the oxide in this manner is that it adds a mask step which increases the cost of the process and can be misaligned, thereby requiring an increase in the size of the die to allow for misalignment. In addition, the oxide passivation 30 extends out about 5 microns ($\mu$) past the edge of the active area 40, and the nitride extends out about 5$\mu$ past the oxide 30 thereby increasing the size of each die which is contrary to design goals.

A semiconductor device which has reduced susceptibility to mobile ion contamination which does not require an additional mask step and does not increase the die size would be a desirable structure.

SUMMARY OF THE INVENTION

An object of the invention is to provide a semiconductor device which has reduced susceptibility to contamination from mobile ions without requiring an additional mask step and without increasing the die size.

This object of the invention is realized by forming a barrier around the periphery of the die. The barrier can be manufactured from a multitude of metals, metal alloys, or other materials which prevent the passage of mobile ions, but is preferably manufactured during the formation of the first metal layer, and therefore from the same material as the first metal layer. Tungsten and tungsten alloys are two examples of commonly used Metal1 materials.

Other objects and advantages of the invention will become apparent to those skilled in the art from the following detailed description read in conjunction with the appended claims and the drawings attached hereto.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 3:
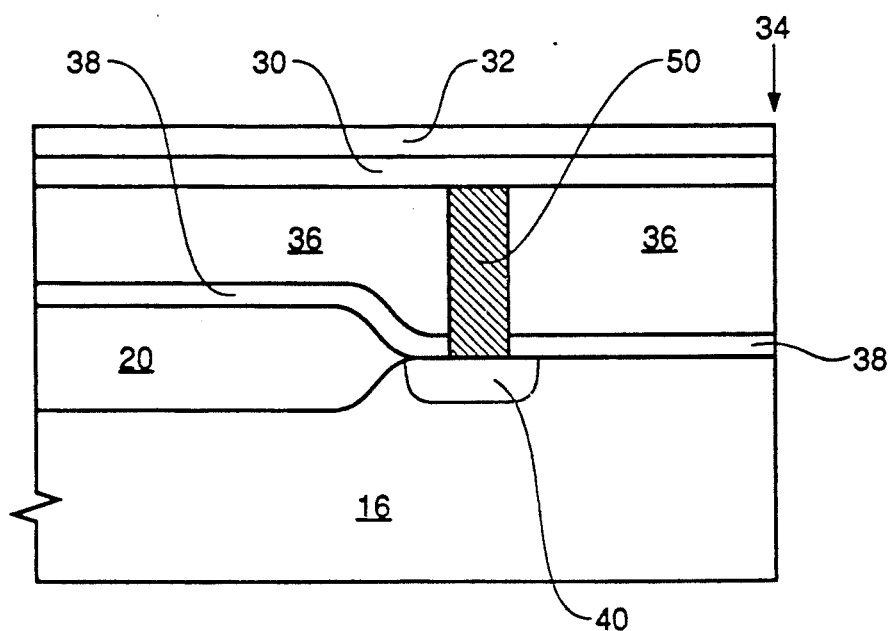
FIG. 3 is a cross section of the inventive device having a barrier around the periphery of the device.
Figure 4:
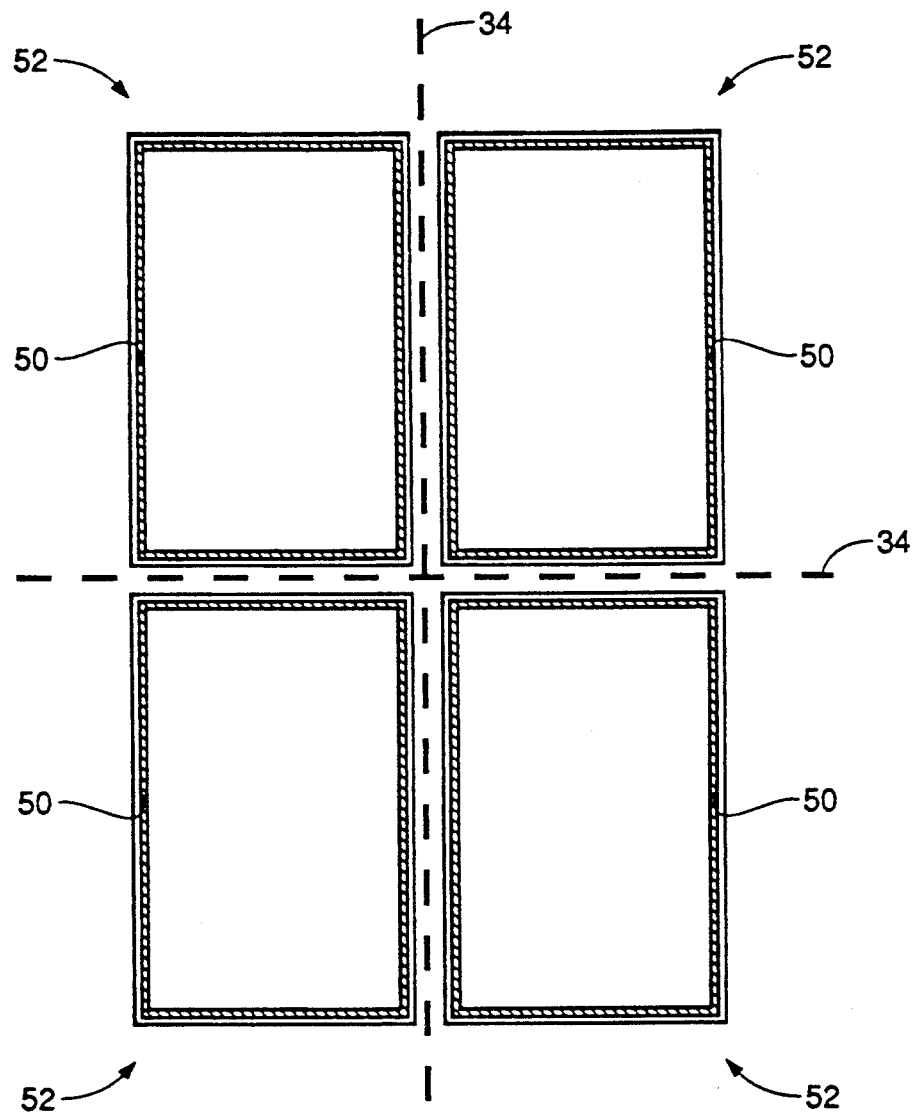
FIG. 4 is a greatly reduced top view of the structure of FIG. 3.

FIG. 3 is a cross section of a semiconductor device showing the inventive barrier feature, and FIG. 4 is a top view. The feature 50 is preferably formed during the formation of the Metal1 layer, which conventionally forms contacts to the substrate 16, but could conceivably be constructed at any point in the fabrication process. Its formation is described herein with reference to Metal1, however, as its incorporation into the Metal1 mask is preferential in most cases as formation of the barrier along with Metal1 would allow for the construction of the barrier without requiring an additional mask step. The width of the barrier would vary from device to device, depending on the design rules for the current product. The barrier, for example, could be as wide as the substrate contacts. FIG. 3 shows a barrier that consists of a single layer, contacts the substrate, and overlies only the substrate. Other configurations, such as a second barrier layer which contacts the first barrier, may also be possible.

In one embodiment, the barrier 50 is completely continuous around the periphery of the die 52. This would prevent mobile ion contamination during the separation of the die during the wafer saw step. There may be die designs which do not lend themselves well to a continuous barrier around the periphery, and a discontinuous barrier (not shown) would reduce the contamination in those areas where it protects the oxide or other layers.

The process for forming the inventive structure begins during the normal course of forming the Metal1 layer, after the formation of the gate oxide 38 (normally TEOS) and a BPSG layer 36. During contact formation, a mask defines the contact area and an etch is performed to expose the substrate 16. If the barrier 50 is formed during the same steps as Metal1, the same mask defines the contact holes and the barrier with photoresist. The material defined by the photoresist is removed to the substrate to form the contact holes, and a metal layer is formed, for example from tungsten or tungsten alloy by processes such as sputtering, chemical vapor deposition, or annealing. The metal layer is then typically planarized, which removes the metal from the wafer surface resulting in a metal plug, and wafer processing continues. The barrier formation would thereby be compatible with the steps used to form the contacts.

Before the formation of the barrier 50, the portion of the substrate 16 below the barrier must be doped to form an active area 40. An N+, P+, or other doped regions in the substrate 16 function equally well. The active area which is electrically coupled with the barrier is necessary to properly terminate the edge of the die 52. The barrier 50 thereby provides a termination for all layers below first metal, as well as providing the barrier to mobile ions. The barrier 50 can contact the active area 40 as shown, or it can be electrically coupled with the active area 40 by contact with another conductive feature.

Figure 1:
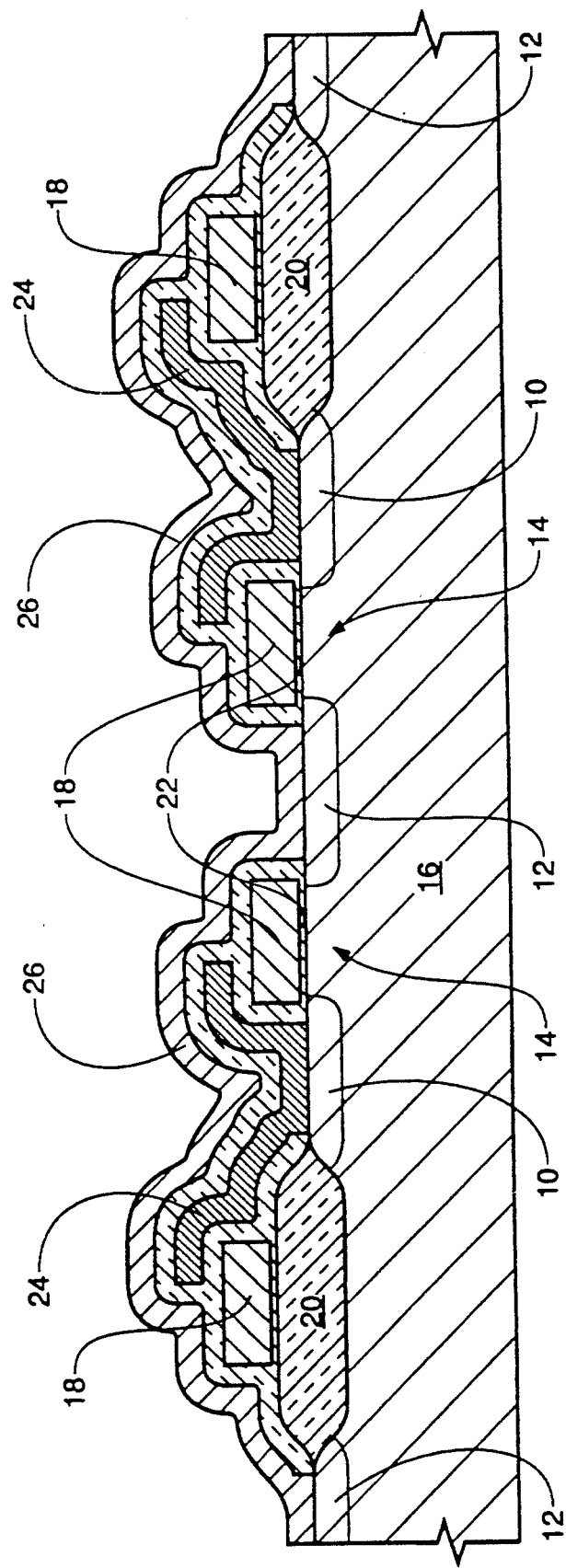
FIG. 1 is a cross section of a typical dynamic random access memory device.
Figure 2:
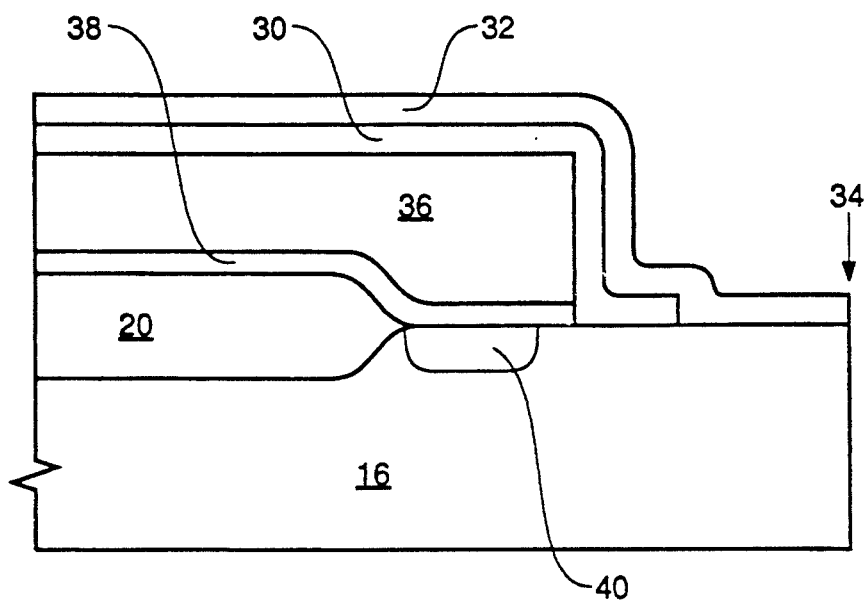
FIG. 2 is a cross section of a semiconductor device having a termination of the dielectric layers around the periphery of the device.

The invention does not increase the size of the die as does the conventional method of terminating the die as described in FIG. 2, as the 5$\mu$ of passivating nitride 32 which extends past the oxide 30 is not required. The saw kerf 34, however, should not be closer than about 5$\mu$ to the active area 40, which is also required with the conventionally terminated die. With the inventive method of terminating the edge of the die, each die is reduced about 10$\mu$ (0.39 mils) in each direction as compared with a conventionally terminated die. The saw kerf 34 can be close to the barrier 50, as long as the barrier 50 is not contacted by the saw during the die separation process.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, it would be possible to make contact to the Metal1 barrier with Metal2 and form a higher barrier, thereby protecting layers above Metal1. It is therefore contemplated that the appended claims will cover any such modifications or embodiments as fall within the true scope of the invention.

I claim:

1. A semiconductor device having a die, said die comprising:

a) a substrate;

b) a plurality of impurity regions formed in said substrate;
c) a dielectric layer formed over said substrate;
d) a conductive layer formed over said substrate wherein said impurity regions, said dielectric layer, and said conductive layer form circuitry; and
e) a barrier formed over said substrate, said barrier being peripherally located on said die with respect to said circuitry, said barrier overlying only said substrate and being electrically coupled with at least one of said impurity regions,
whereby said barrier protects said dielectric to reduce the entrance of mobile ions into said dielectric layer.

2. The semiconductor device of claim 1 wherein said barrier layer comprises a metal.

3. The semiconductor device of claim 1 wherein said barrier layer comprises tungsten.

4. The semiconductor device of claim 1 wherein said barrier layer comprises a tungsten alloy.

5. The semiconductor device of claim 1 wherein said barrier layer is continuous and continuously surrounds said circuitry thereby.

6. The semiconductor device of claim 1 wherein said barrier layer has a void therein and is discontinuous thereby.

7. A random access memory device having a die, said die comprising:
a) a substrate;
b) a plurality of impurity regions formed in said substrate;
c) a dielectric layer formed over said substrate;
d) a conductive layer formed over said substrate wherein said impurity regions, said dielectric layer, and said conductive layer form circuitry; and
e) a barrier formed over said substrate, said barrier being peripherally located on said die with respect to said circuitry, said barrier overlying only said substrate and being electrically coupled with at least one of said impurity regions,
whereby said barrier protects said dielectric layer to reduce the entrance of mobile ions into said dielectric layer.

8. The random access memory device of claim 7 wherein said barrier layer comprises a metal.

9. The random access memory device of claim 7 wherein said barrier layer comprises tungsten.

10. The random access memory device of claim 7 wherein said barrier layer comprises a tungsten alloy.

11. The random access memory device of claim 7 wherein said barrier layer is continuous and continuously surrounds said circuitry thereby.

12. The random access memory device of claim 7 wherein said barrier layer has a void therein and is discontinuous thereby.

13. A dynamic random access memory device having a die, said die comprising:
a) a substrate;
b) a plurality of doped active areas formed in said substrate;
c) a dielectric layer comprising oxide formed over said substrate;
d) a conductive polycrystalline silicon layer formed over said substrate wherein said active areas, said dielectric layer, and said polycrystalline silicon layer form circuitry; and
e) a barrier comprising tungsten formed over said substrate, said barrier being peripherally located on said die with respect to said circuitry, said barrier overlying only said substrate and being electrically coupled with at least one of said active areas,
whereby said barrier protects said dielectric layer to reduce the entrance of contaminating mobile ions into said dielectric layer.

14. The dynamic random access memory device of claim 13 wherein said barrier layer comprises an alloy of tungsten.

15. The dynamic random access memory device of claim 13 wherein said barrier layer is continuous and continuously surrounds said circuitry thereby.

16. The dynamic random access memory device of claim 13 wherein said barrier layer has a void therein and is discontinuous thereby.

17. The dynamic random access memory device of claim 13 wherein said dielectric layer comprises tetraethyl orthosilicate.

18. The dynamic random access memory device of claim 17, further comprising a layer of borophosphosilicate glass.

19. The semiconductor device of claim 1 wherein said barrier consists of a single layer and contacts said substrate.

20. The random access memory device of claim 7 wherein said barrier consists of a single layer and contacts said substrate.

21. The dynamic random access memory device of claim 13 wherein said barrier consists of a single layer and contacts said substrate.

* * * * *